United States Patent [19]
Furuchi et al.

[11] Patent Number: 5,767,719
[45] Date of Patent: Jun. 16, 1998

[54] DELAY CIRCUIT USING CAPACITOR AND TRANSISTOR

[75] Inventors: Masaki Furuchi; Masahiko Hirai, both of Tokyo, Japan

[73] Assignee: NEC Corporation, Tokyo, Japan

[21] Appl. No.: 680,975

[22] Filed: Jul. 16, 1996

Related U.S. Application Data

[63] Continuation of Ser. No. 325,480, Oct. 19, 1994, abandoned.

[30] Foreign Application Priority Data

Nov. 25, 1993 [JP] Japan ................... 93-317503

[51] Int. Cl.$^6$ ............................................... H03K 5/13
[52] U.S. Cl. .................... 327/281; 327/288; 327/262
[58] Field of Search ............................ 327/281, 276, 327/277, 278, 284, 285, 288, 262, 378, 541, 261, 263, 264, 77, 74, 68, 69, 75

[56] References Cited

U.S. PATENT DOCUMENTS

| | | | |
|---|---|---|---|
| 4,644,182 | 2/1987 | Kawashima et al. | 327/288 |
| 4,701,714 | 10/1987 | Agoston | 327/277 |
| 4,821,003 | 4/1989 | Kameya | 327/277 |
| 5,012,142 | 4/1991 | Sonntag | 327/288 |
| 5,051,630 | 9/1991 | Kogan et al. | 327/285 |
| 5,055,706 | 10/1991 | Nakai et al. | 327/263 |
| 5,068,553 | 11/1991 | Love | 327/288 |
| 5,101,117 | 3/1992 | Johnson et al. | 327/277 |
| 5,107,153 | 4/1992 | Osaki et al. | 327/288 |
| 5,180,938 | 1/1993 | Sin | 327/288 |
| 5,287,025 | 2/1994 | Nishimichi | 327/281 |
| 5,289,051 | 2/1994 | Zitta | 327/170 |
| 5,352,945 | 10/1994 | Casper et al. | 327/262 |
| 5,537,070 | 7/1996 | Risinger | 327/262 |

FOREIGN PATENT DOCUMENTS

| | | | |
|---|---|---|---|
| 4330600A1 | 3/1994 | Germany. | |
| 57-5432 | 1/1982 | Japan | 327/278 |
| 0130917 | 7/1985 | Japan | 327/288 |
| 63-74211 | 4/1988 | Japan | 327/262 |
| 63-266920 | 11/1988 | Japan | 327/288 |
| 4258017 | 9/1992 | Japan | 327/288 |
| 5-206805 | 8/1993 | Japan | 327/264 |

OTHER PUBLICATIONS

Sedra & Smith, "Microelectronic Circuits", pp. 312–316. 1991.
Robert F. Pierret, "Field Effect Devices", vol. IV, pp. 115–122. 1990.
Bazes, et al. "A Novel CMOS Digital Clock and Data Decoder", IEEE Journal of Solid–State Circuits, No. 12, dtd Dec. 1992, pp. 1934–1940.
"Variable Delay Digital Circuit", IBM Technical Disclosure Bulletin V35 N4A, dtd Sep. 1992, pp. 365–366.
European Search Report.

*Primary Examiner*—Timothy P. Callahan
*Assistant Examiner*—Eunja Shin
*Attorney, Agent, or Firm*—Whitham, Curtis & Whitham

[57] ABSTRACT

A delay circuit comprising at least one capacitor with one electrode thereof is connected to a fixed potential, a signal transmission line, and at least one switch means between the other electrode of the capacitor and the signal transmission line. The switch means makes electrical connection or disconnection between the capacitor and the signal transmission line in accordance with an actual supply voltage value.

3 Claims, 4 Drawing Sheets

DELAY CIRCUIT USING CAPACITOR AND TRANSISTOR

This is a Continuation of application Ser. No. 08/325,480 filed Oct. 19, 1994, now abandoned.

BACKGROUND OF THE INVENTION

This invention relates to a delay circuit and, more particularly, to such a circuit for delaying a signal applied thereto by utilizing charging and discharging a capacitor.

In an electronic circuit, a delay circuit utilizing charging and discharging a capacitor is called an analog delay circuit and is widely used to get a desired delayed signal.

Referring to FIG. 1, a typical analog delay circuit, includes an inverter 403 having an input node supplied with an input signal 401 and an output node connected to a line 411 and further to one electrode of a capacitor 409. The line 411 is connected to the input of an inverter 404. The other electrode of capacitor 409 is grounded. The inverter 404 outputs a delayed signal 402. The inverter 403 consists of a P-channel MOS (referred to as PMOS hereinafter) transistor 412 and a N-channel MOS (referred to as NMOS) transistor 413 connected in series with their common gates receiving common input signal 401 and with their drains connected to the line 411. The source of PMOS transistor 412 is connected to a power supply Vdd and the source of NMOS transistor 413 to ground.

In this circuit, when the input signal 401 is at the low level, the PMOS transistor 412 of an inverter gate 403 is in on-state and an NMOS transistor 413 is in off-state. The capacitor 409 is thereby charged through the PMOS transistor 412 and the line 411 to a potential near to supply voltage $V_{DD}$. The output signal 402 goes to the low level.

When the input signal 401 changes to the high level, the PMOS transistor 412 is turned off, and NMOS transistor 413 is turned on. Consequently, the capacitor 409 is discharged through the NMOS transistor 413 and the line 411 to a potential nearly equal to the ground potential. The output signal 402 thus goes to the high level.

In discharging the capacitor 409, there is a time constant RC determined by the on-resistance R of the NMOS transistor 413 and the capacitance C of the capacitor 409. Thus, the output signal 402 responds to the change of input signal 401 from the low level to the high level and moves to the high level with a delay time depending on the time constant RC. The on-resistance R of the NMOS transistor 413 depends on temperature and other parameters for transistor manufacture, and further varies with the voltage applied to the gate thereof. The voltage applied to the gate of the transistor 413 is determined by the power voltage Vcc. That is, depends on a voltage applied to the gate, and the delay time is also dependent on the power voltage and thus changeable in accordance with the variation of the power voltage.

SUMMARY OF THE INVENTION

It is therefore a major object of the present invention to provide a delay circuit representing a delay time of a reduced supply voltage dependence.

A delay circuit according to the present invention comprises one capacitor having a first terminal connected to a reference potential, a signal transmission line, and at least one switch element connected between the other electrode of the capacitor and the signal transmission line and controlled to be rendered conductive or nonconductive in response to a voltage level of a power supply voltage.

The switching element can be composed of at least one NMOS transistor or PMOS transistor. When the power supply voltage value becomes lower than the threshold value of the transistor, the transistor is turned OFF.

In a preferred embodiment, there are provided a plurality of capacitors each having one electrode connected to the reference potential and one or a plurality of series-connected MOS transistors, each with the gate thereof connected to the drain thereof, connected between the other electrode of each capacitor and the signal transmission line.

With the above construction, when the power supply voltage is lowered, the capacitor is disconnected from the signal transmission line. As a result, the time constant is reduced to such a level as determined by a stray capacitance of the signal transmission line and a resistance of a driving circuit for the signal transmission line.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENTS

Figure 5A:
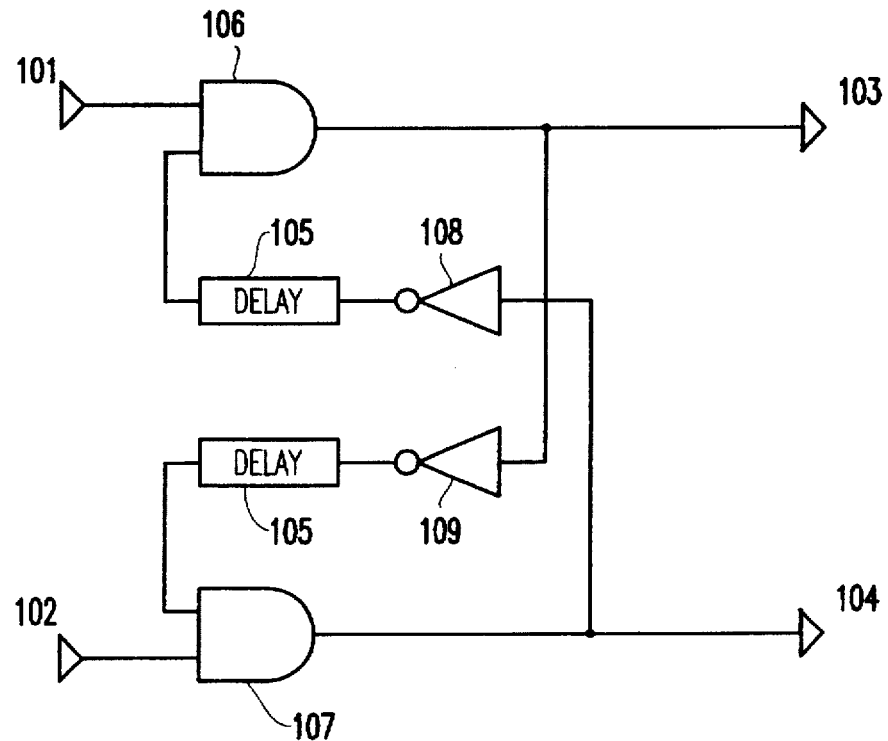
FIGS. 5A and 5B are a circuit diagram of a two-phase clock generator having delay circuits according to the present invention and a timing chart indicative of an operation of the generator, respectively.

Before describing the embodiments of the present invention, an application circuit of a delay circuit will be first described below with reference to FIG. 5. Shown in FIG. 5A is a two-phase clock generator having delay circuits according to the present invention. This generator includes a cross-coupled pair of circuits each including a two-input AND gate 106 (107) into one input of which a signal 101 (102) is supplied, a delay circuit 105 of which the output is connected to the other input of the AND gate 106 (107), and an inverter 108 (109) of which the output is connected to the delay circuit 105 and the input is connected to the output of the AND gate 107 (106). The output of the gates 106 and 107 are lead out as output terminals 103 and 104, respectively, which in turn generate two-phase clock signals. These clock signals are widely used as internal clocks of microcomputers.

Figure 5B:
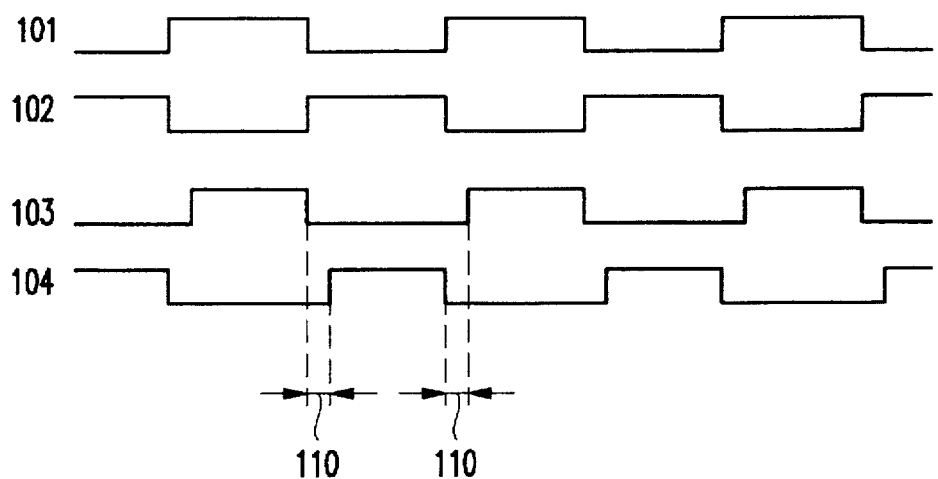

Referring to the timing chart of FIG. 5B, the operation of the two-phase clock generator will be set forth. As understood from the chart, the two-phase clock generator generates, from a pair of input signals 101 and 102 having the inverted logic relationship to each other, two-phase clock signals 103 and 104 not overlapping during an active high level period. That is, there are inactive low level periods as indicated by the reference numeral 110 between the two-phase clock output signals 103 and 104. These periods 110 are derived by masking the clock signals 101 or 102 by the output of each delay circuit 105 as determined by its delay time.

To implement the high-speed operation of the microcomputer, it is preferred to reduce the inactive low level period as short as possible without the microcomputer malfunctioning.

Figure 1:
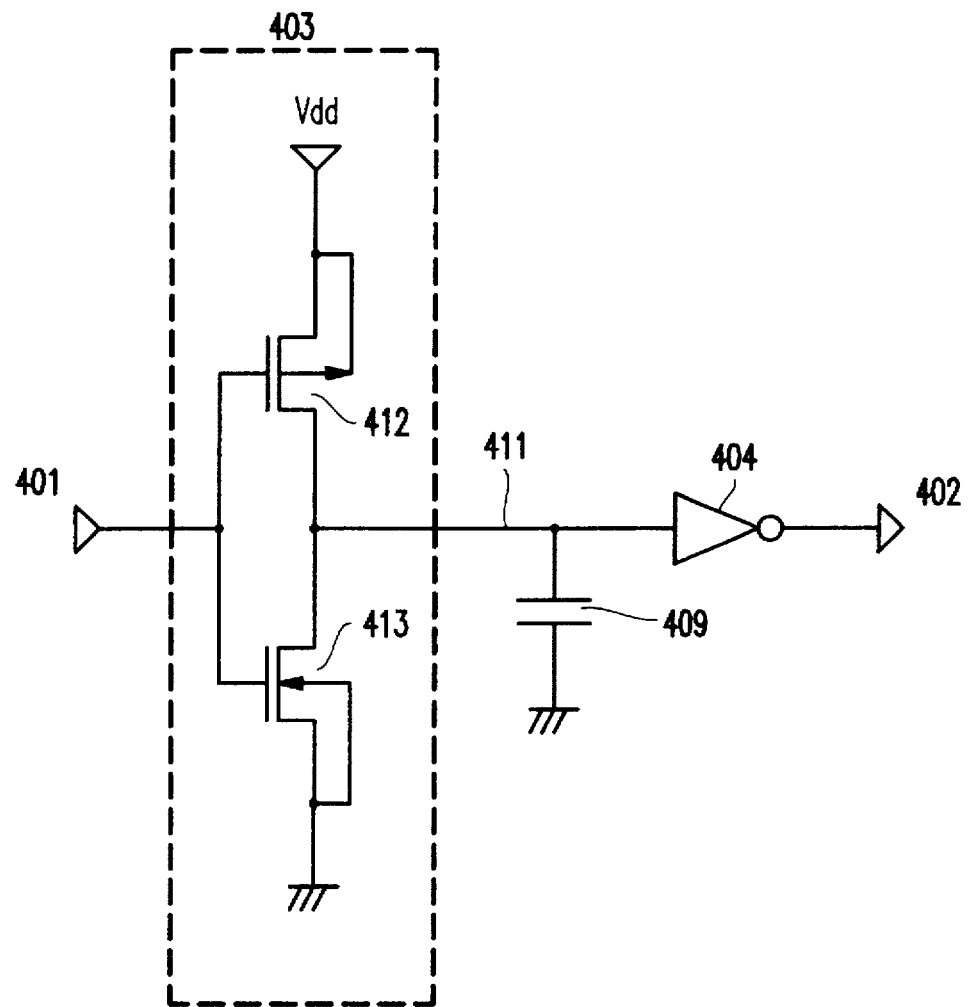
FIG. 1 is a circuit diagram illustrative of the prior art.
Figure 2:
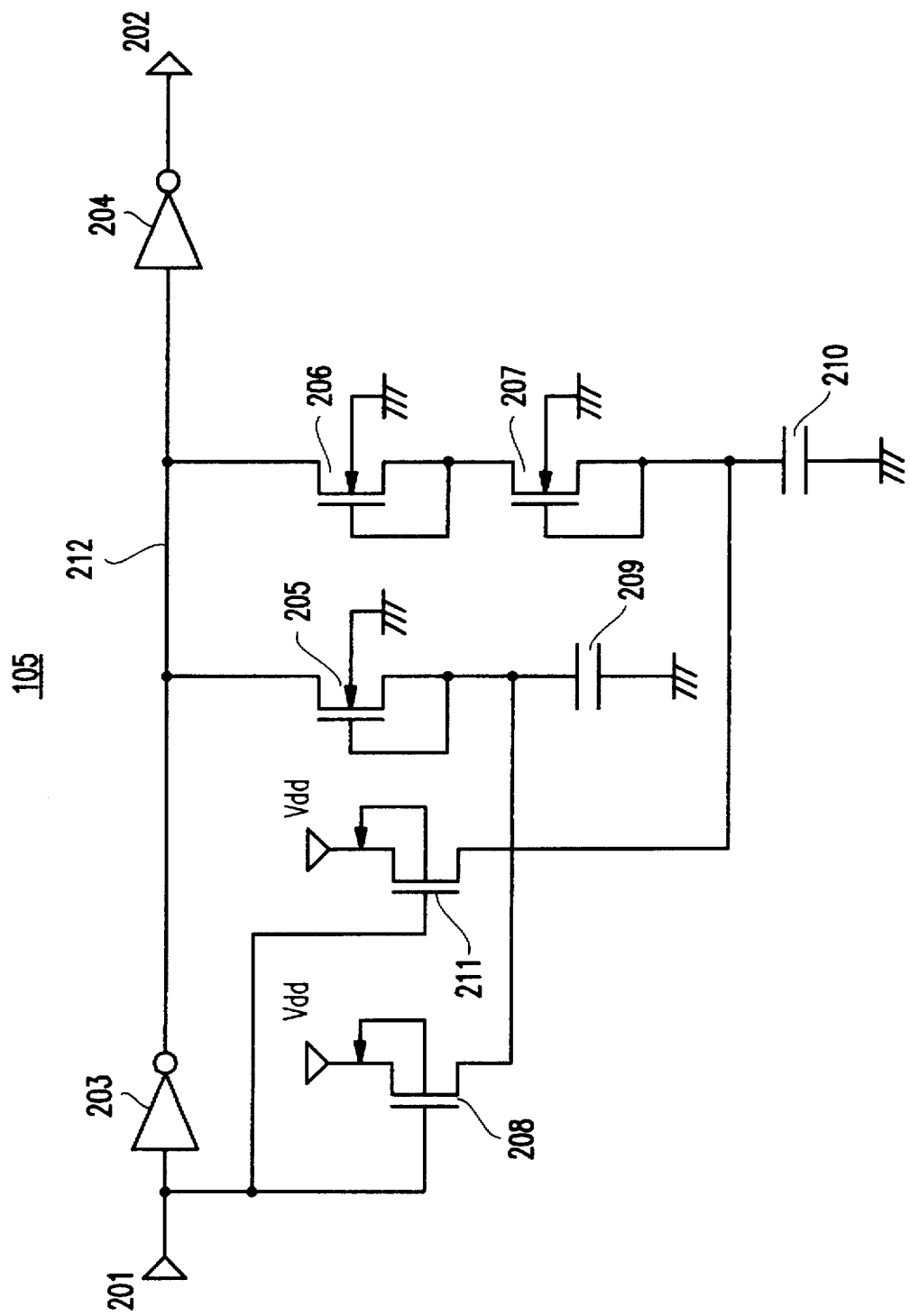
FIG. 2 is a circuit diagram showing a delay circuit according to an embodiment of the present invention.

Referring now to FIG. 2, the delay circuit 105 includes an input terminal 201 receiving the output of the inverter 108 (109) and which is connected to the input of an inverter 203. The output of the inverter 203 is connected to a signal transmission line 212 to another inverter 204 from which an output signal 202 is in turn derived. The line 212 is further connected to an NMOS transistor 205 having the gate connected to the drain and further to a capacitor 209 which is grounded. The line 212 is also connected through two series-connected NMOS transistors 206 and 207 each with the gate connected to the drain to a capacitor 210 which is grounded. The input terminal 201 is further connected to the gate of a PMOS transistor 208 whose drain is connected to the node between the drain of the NMOS transistor 205 and the capacitor 209, and further to the gate of a PMOS transistor 211 whose drain is connected to the node between the drain of the NMOS transistor 207 and the capacitor 210. The sources of these transistors 208 and 211 are connected to the power supply terminals Vdd. Each of the inverters 203 and 204 is a complementary MOS inverter consisting of a pair of PMOS and NMOS transistors similarly to the inverter gate 403 shown in FIG. 1.

The operation of the delay circuit of this embodiment will be described below. Firstly the operation will be described assumming that supply voltage Vdd is higher than twice the threshold voltage Vt of each of the NMOS transistors 205, 206 and 207.

When the input signal 201 is at low level, the output of the inverter 203 goes to the high level, thereby turning NMOS transistors 205, 206 and 207 off. Hereinafter, the high level is referred to as Vdd level, and the low level as GND level to distinguish that the high level is a potential varying with changing supply voltage Vdd.

On the other hand, the PMOS transistors 208 and 211 are turned on so that the capacitors 209 and 210 are charged to the Vdd level. The output 202 is at the GND level.

When the input signal 201 changes to Vdd level, both the PMOS transistors 208 and 211 are turned off, and the output of the inverter 203 changes from Vdd level to GND level, thus line 212 going to the GND level. Then all the gate-source voltages of the NMOS transistors 205, 206 and 207 exceeds the threshold voltage Vt, and consequently they are turned on.

Under the circumstances where the output of the inverter 203 is at GND level and hence the NMOS transistors 205, 206 and 207 are in the on-state, the charges accumulated on capacitors 209 and 210 are released through these NMOS transistors and the NMOS transistor (not shown) of the inverter 203, and consequently the line 212 will drop gradually to GND level.

When the line 212 reaches the GND level, output 202 is inverted to Vdd level but with delay of the time taken for the capacitors 209 and 210 to be discharged.

Next, the operation will be described assuming that supply voltage Vdd is somewhat higher than the threshold voltage Vt. When the input signal 201 is at GND level, the output of the inverter 203 goes to the Vdd level. Accordingly all the NMOS transistors 205, 206, 207 are turned off, and both PMOS transistors 208, 211 are turned on. Consequently the capacitors 209, 210 are charged. In this case the output 202 goes to the GND level.

Now, once the input signal 201 changes from the GND level to the Vdd level, both PMOS transistors 208, 211 are turned off, and the output of the inverter 203 goes to the GND level.

This change of the output of the inverter 203 to the GND level turns only the NMOS transistors 205 on. Consequently the charge accumulated into the capacitor 209 is released through this NMOS transistor 205 and the NMOS transistor (not shown) of the inverter 203. Thus the line 212 connected to the output of inverter gate 203 drops gradually to GND level. When line 212 reaches GND level, the output 202 is inverted to Vdd level but with a delay of the time taken for the capacitor 209 to be discharged.

Unlike when supply voltage Vdd is higher than twice the threshold voltage Vt of the NMOS transistors 205, 206, 207, in this case NMOS transistors 206, 207 will not be turned on, and hence the capacitor 210 remains disconnected from line 212.

When the supply voltage Vdd further drops to a lower voltage than the threshold voltage Vt of each of the NMOS transistors 205, 206, 207, these NMOS transistors are turned off. Consequently, the capacitors 209, 210 remain electrically disconnected from the line 212. In this case, the delay time associated with the trailing edge of the output signal of the inverter 203 is determined by time constant $RC_1$ and this capacitance value $C_1$ contains only the parasitic or stray capacitance of the line 212.

In the delay circuit of this embodiment, the charges of the capacitors 209, 210 are released through the NMOS transistor of the inverter 203. As described above, the on-resistance of the MOS transistor becomes larger as the gate voltage becomes lower, and accordingly the discharge time increases with decreasing supply voltage Vdd. On the other hand, in the delay circuit of this embodiment, when the supply voltage Vdd drops, the capacitors are selectively disconnected from the line 212 in accordance with the dropped supply voltage value. In this way it is possible to reduce change in the discharge time, contributing to reducing the variation of delay time due to supply voltage variation.

Furthermore instead of the construction of FIG. 2 in which the input 201 is connected through the PMOS transistor 208 to the capacitor 209 and through the PMOS transistor 211 to the capacitor 210, it may be allowed to use only one PMOS transistor such as 208 having a drain connected in common to both the capacitors 209 and 210.

Figure 3:
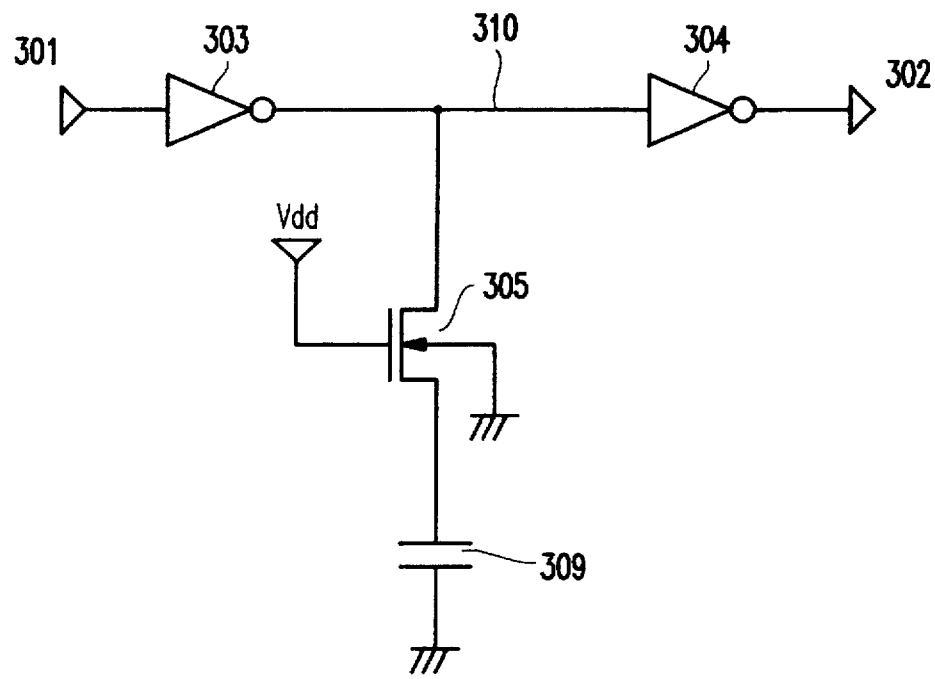
FIG. 3 is a circuit diagram showing another embodiment of the present invention.

The above delay circuit can be simplified in circuit construction when there is no need for precise adjustment of the capacitance value. Such a simplified delay circuit is shown in FIG. 3 as another embodiment of the present invention. This circuit includes two inverters 303 and 304, a capacitor 309 and one NMOS transistor 305 which are connected as shown. In particular, the NMOS transistor 305 is connected between the signal transmission line 310 and the capacitor 309. When supply voltage Vdd is lower than the threshold voltage Vt of the transistor 304, the MOS transistor 305 is turned off to disconnect the capacitor 309 from the line 310.

Figure 4:
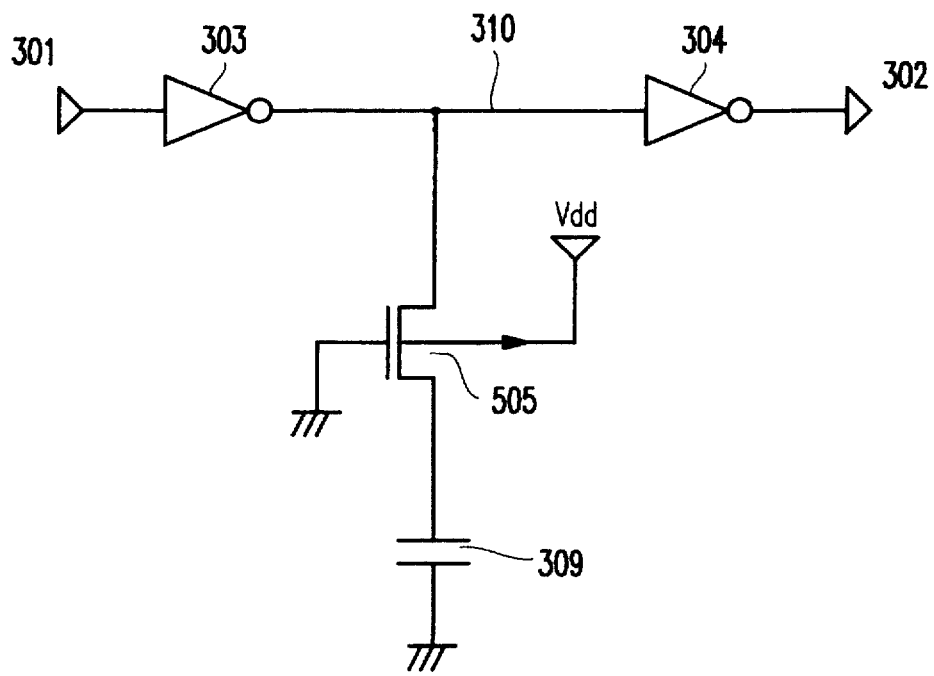
FIG. 4 is a circuit diagram showing still another embodiment of the present invention.

Turning to FIG. 4, a delay circuit according to still another embodiment of the present invention employs, in place of the NMOS transistor 305 shown in FIG. 3, a PMOS transistor 505 having the front gate grounded and the back gate connected to Vdd. When the supply voltage Vdd is lower than threshold voltage Vt of the PMOS transistor 505, this transistor is turned off to disconnect the capacitor 305 from the line 310.

The circuit simulation of the above-mentioned embodiments with MOS transistor models manufactured in a specified process gave the results that the difference in delay time at supply voltages of 5 V and at 1.8 V was 23 ns for the delay circuits according to the present invention, which was reduced compared with 33 ns for the conventional delay circuit. This proves that the variation in delay time due to the change in supply voltage from 5 V to 1.8 V is improved as much as about 30% over the conventional delay circuit.

The embodiments of the present invention which have been described above are not to be considered as limiting the scope thereof but may be changed and modified within the scope of the spirit of the present invention. For example, in the place of two capacitors 209, 210 in the first embodiment, a construction can be applied which consists of two or more capacitors, and two or more series-connected NMOS transistors connected between the capacitors and the line so that the delay time is more finely adjustable according to the potential level of supply voltage Vdd.

As described above, the delay circuit of the present invention has the construction that the capacitance associated with the signal transmission line varies with the supply voltage, and thereby the dependence of the delay time on the supply voltage is remarkably improved. The circuit simulation with MOS transistor models manufactured under some manufacture conditions gave the results that the difference in delay time at supply voltages of 5 V and at 1.8 V was 23 ns for the delay circuits according to the present invention and 33 ns for the conventional delay circuit. Thus the present invention has been proven to improve change in delay time as much as about 30%.

Furthermore according to the present invention, there are provided a plurality of capacitors and at least one MOS transistor between each capacitor and the signal transmission line. The capacitors are controlled to be selectively disconnected from the signal transmission line in accordance with the actual supply voltage so that the capacitances which are essential for determining the time constant can be finely adjusted. Thus the variation in delay time associated with change of the supply voltage is remarkably reduced.

Additionally according to the present invention, one MOS transistor is provided between the capacitor and the signal transmission line so as to be turned off when the supply voltage is lower than the threshold voltage of the MOS transistor. This simplified construction can reduce the variation in the delay time depending on the supply voltage variation in a delay circuit needing no fine adjustment of the capacitance.

What is claimed is:

1. A delay circuit comprising:

an input terminal supplied with an input signal;

an inverter having an input node connected to said input terminal and an output node;

a signal transmission line connected to said output node;

a first P-channel metal oxide semiconductor ("MOS") transistor connected to said input terminal;

a first N-channel MOS transistor connected to said signal transmission line;

a power voltage supply line connected to said first P-channel MOS transistor;

a ground voltage supply line operatively connected to said first P-channel MOS transistor;

a first capacitor connected to said ground voltage supply line;

a first node positioned between said first P-channel MOS transistor and said first capacitor;

a second capacitor connected to said ground voltage supply line;

a second P-channel MOS transistor having a front gate connected to said input terminal;

a second N-channel MOS transistor connected to said signal transmission line, said second N-channel MOS transistor having a front gate;

a third N-channel MOS transistor having a front gate connected to said second capacitor:

a second node positioned between said second N-channel MOS transistor and said third N-channel MOS transistor and being connected to said front gate of said second N-channel MOS transistor; and a third node positioned between said third N-channel MOS transistor and said second capacitor;

said first P-channel MOS transistor forming a first source-drain current path between said power voltage supply line and said first node, said first P-channel MOS transistor including a front gate connected to said input terminal, said first N-channel MOS transistor forming a second source-drain current path between said signal transmission line and said first node, and said first N-channel MOS transistor including a front gate connected to said first node, said second P-channel MOS transistor forming a third source-drain current path between said power voltage supply line and said third node, said second N-channel MOS transistor forming a fourth source-drain current path between said signal transmission line and said second node, and said third N-channel MOS transistor forming a fifth source-drain current path between said second node and said third node.

2. A delay circuit as in claim 1, wherein a signal on said power voltage supply line variably controls said second source-drain current path.

3. A delay circuit as in claim 1, wherein said signal transmission line includes an output terminal, and said delay circuit further comprising a second inverter connected to said output terminal.

* * * * *